United States Patent
Bajaj et al.

(10) Patent No.: US 12,387,946 B2
(45) Date of Patent: Aug. 12, 2025

(54) DOUBLE-SIDED SCRUBBER FOR SUBSTRATE CLEANING

(71) Applicant: Yield Engineering Systems, Inc., Fremont, CA (US)

(72) Inventors: Rajeev Bajaj, San Jose, CA (US); Al Stone, Bloomingdale, IL (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 18/377,147

(22) Filed: Oct. 5, 2023

(65) Prior Publication Data

US 2025/0114824 A1    Apr. 10, 2025

(51) Int. Cl.
| | |
|---|---|
| *H01L 21/00* | (2006.01) |
| *B08B 1/12* | (2024.01) |
| *B08B 1/20* | (2024.01) |
| *B08B 1/32* | (2024.01) |
| *B08B 3/02* | (2006.01) |
| *B08B 3/08* | (2006.01) |
| *H01L 21/02* | (2006.01) |
| *H01L 21/67* | (2006.01) |

(52) U.S. Cl.
CPC .......... *H01L 21/67046* (2013.01); *B08B 1/12* (2024.01); *B08B 1/20* (2024.01); *B08B 1/32* (2024.01); *B08B 3/022* (2013.01); *B08B 3/08* (2013.01); *H01L 21/02057* (2013.01); *H01L 21/67051* (2013.01); *B08B 2203/02* (2013.01)

(58) Field of Classification Search
None
See application file for complete search history.

(56) References Cited

U.S. PATENT DOCUMENTS

2022/0125193 A1*  4/2022  Hsu ........................ B29C 39/006

FOREIGN PATENT DOCUMENTS

| CN | 105983546 | * 10/2016 |
|---|---|---|
| JP | H09262557 | * 10/1997 |
| JP | 2003142444 | * 5/2003 |
| JP | 2010098237 | * 4/2010 |
| KR | 200477678 | * 7/2015 |

OTHER PUBLICATIONS

Translation of JPH09262557 by Takahashi, published Oct. 7, 1997.*
Translation of KR200477678 by Yongjun, published Jul. 7, 2015.*
Translation of JP2003142444 by Taoka, published May 16, 2003.*
Translation of JP2010098237 by Kobori, published Apr. 30, 2010.*
Translation of CN105983546 by Zhu, published Oct. 5, 2016.*

* cited by examiner

*Primary Examiner* — Michael E Barr
*Assistant Examiner* — Ryan L Coleman
(74) *Attorney, Agent, or Firm* — Finnegan, Henderson, Farabow, Garrett & Dunner, LLP

(57) ABSTRACT

A substrate cleaning device includes a double-sided scrubber that directs a liquid to a substrate as it moves back-and-forth between a pair of rotating brushes. The device may also include a first set of nozzles and a second set of nozzles. The first set of nozzles may be configured to spray a first liquid at an interface between the substrate and rotating brushes and the second set of nozzles may be configured to spray a second liquid at the interface as the substrate moves back-and-forth between the pair of rotating brushes.

15 Claims, 3 Drawing Sheets

DOUBLE-SIDED SCRUBBER FOR SUBSTRATE CLEANING

TECHNICAL FIELD

The present disclosure relates to devices and methods for cleaning a substrate, in particular, by wet processing.

BACKGROUND

Semiconductor fabrication process is a highly exacting and intricate one. Semiconductors components are fabricated on a contaminant-free surface. Wet processing is a critical step in semiconductor manufacturing where the surface of a substrate is cleaned of contaminants and prepared for subsequent process steps (e.g., deposition, etching, etc.). A typical wet processing system is a multi-tank system that sequentially processes substrates through multiple chemical-containing tanks with de-ionized water (DI water) rinse tanks in between. For example, one or more substrates may be first dipped in a tank containing a first chemical (e.g., an alkaline solution) to remove a first type of contaminant. Then, to remove the first chemical from the substrate surfaces, the substrate(s) may be dipped in a tank containing DI water. The substrate(s) may then be dipped in a tank containing a second chemical (e.g., an acidic solution) to remove a second type of contaminant. The substrate(s) may be dipped again in a DI water tank to remove the second chemical from the substrate surfaces. Some conventional wet processing applications involve dipping the substrates in 12-15 tanks placed in series to clean the substrate surfaces in preparation for subsequent process steps. A wet processing operation that requires multiple tanks arranged in series may occupy a significant amount of factory floor space in addition to other inefficiencies. The devices and methods of the current disclosure may alleviate at least some of these deficiencies.

SUMMARY

Several embodiments of devices and methods of cleaning a semiconductor substrate are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one embodiment, a device for cleaning a substrate is disclosed. The device includes a double-sided scrubber including a pair of brushes. Each brush of the pair of brushes may be (a) substantially cylindrical and may be configured to rotate about a longitudinal axis of the brush, and (b) extends around a conduit that is configured to direct a liquid through the brush. The pair of brushes may be arranged such that the substrate is configured to move back-and-forth between the pair of brushes with the longitudinal axis of each brush of the pair of brushes extending parallel to each other on opposite sides of the substrate. A first set of nozzles may be fluidly coupled together and configured to spray a first liquid at an interface between the substrate and the pair of brushes. The first set of nozzles may include a plurality of pairs of first nozzles spaced apart from each other along the longitudinal axis of each brush. Each pair of first nozzles may include two first nozzles mirror-symmetrically positioned on opposite sides of the substrate. A second set of nozzles may be fluidly coupled together and configured to spray a second liquid at the interface. The second set of nozzles may include a plurality of pairs of second nozzles spaced apart from each other along the longitudinal axis of each brush. Each pair of second nozzles may include two second nozzles mirror-symmetrically positioned on opposite sides of the substrate.

In another embodiment, a method of cleaning a substrate using a double-sided scrubber is disclosed. The method may include moving a substrate back-and-forth between a pair of rotating brushes of the double-sided scrubber and directing de-ionized water to the moving substrate through the pair of rotating brushes. The method may also include spraying a first liquid through a first set of nozzles at an interface between the substrate and the pair of rotating brushes for a first time period as the substrate moves back-and-forth between the pair of rotating brushes. The method may further include, after the first time period, spraying de-ionized water through a second set of nozzles at the interface between the substrate and the pair of rotating brushes for a second time period as the substrate moves back-and-forth between the pair of rotating brushes.

BRIEF DESCRIPTION OF THE DRAWINGS

The accompanying drawings, which are incorporated in and constitute a part of this disclosure, illustrate simplified schematic representations of exemplary embodiments. Together with the description, these figures are used to explain the disclosed principles. In these drawings, where appropriate, reference numerals illustrating like structures, components, materials, and/or elements in different figures are labeled similarly. It should be noted that the figures are only simplified schematics of exemplary embodiments and there can be many features and variations not shown in these figures. It is understood that various combinations of the structures, components, and/or elements, other than those specifically shown, are contemplated and are within the scope of the present disclosure. Specifically, the scope of the current disclosure is defined by the claims and not by the specific embodiments illustrated in the figures.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between features in a figure. Additionally, even if it is not specifically mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another variation is specified). For example, a feature disclosed as being about "t" units long (wide, thick, etc.) may vary in length from (t−0.1t) to (t+0.1t) units. Similarly, a temperature within a range of about 100-150° C. can be any temperature between (100−10%) and (150+10%). In some cases, the specification also provides context to some of the relative terms used. For example, a structure described as being substantially linear or substantially planar may deviate slightly (e.g., 10% variation in diameter at various locations, etc.) from being perfectly circular or cylindrical. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

Figure 1A:
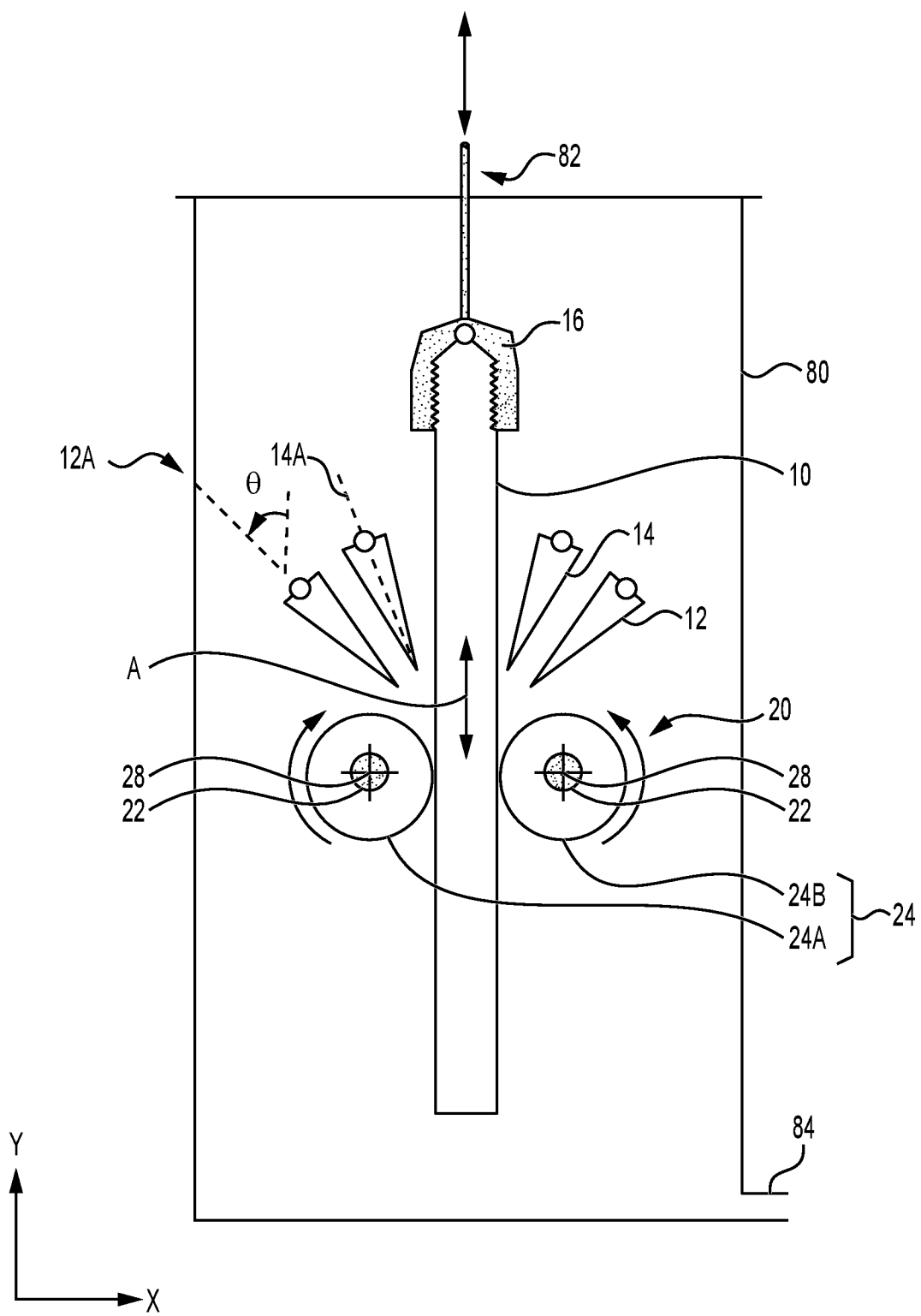
FIG. 1A is a simplified schematic cross-sectional view of an exemplary apparatus of the current disclosure.
Figure 1B:
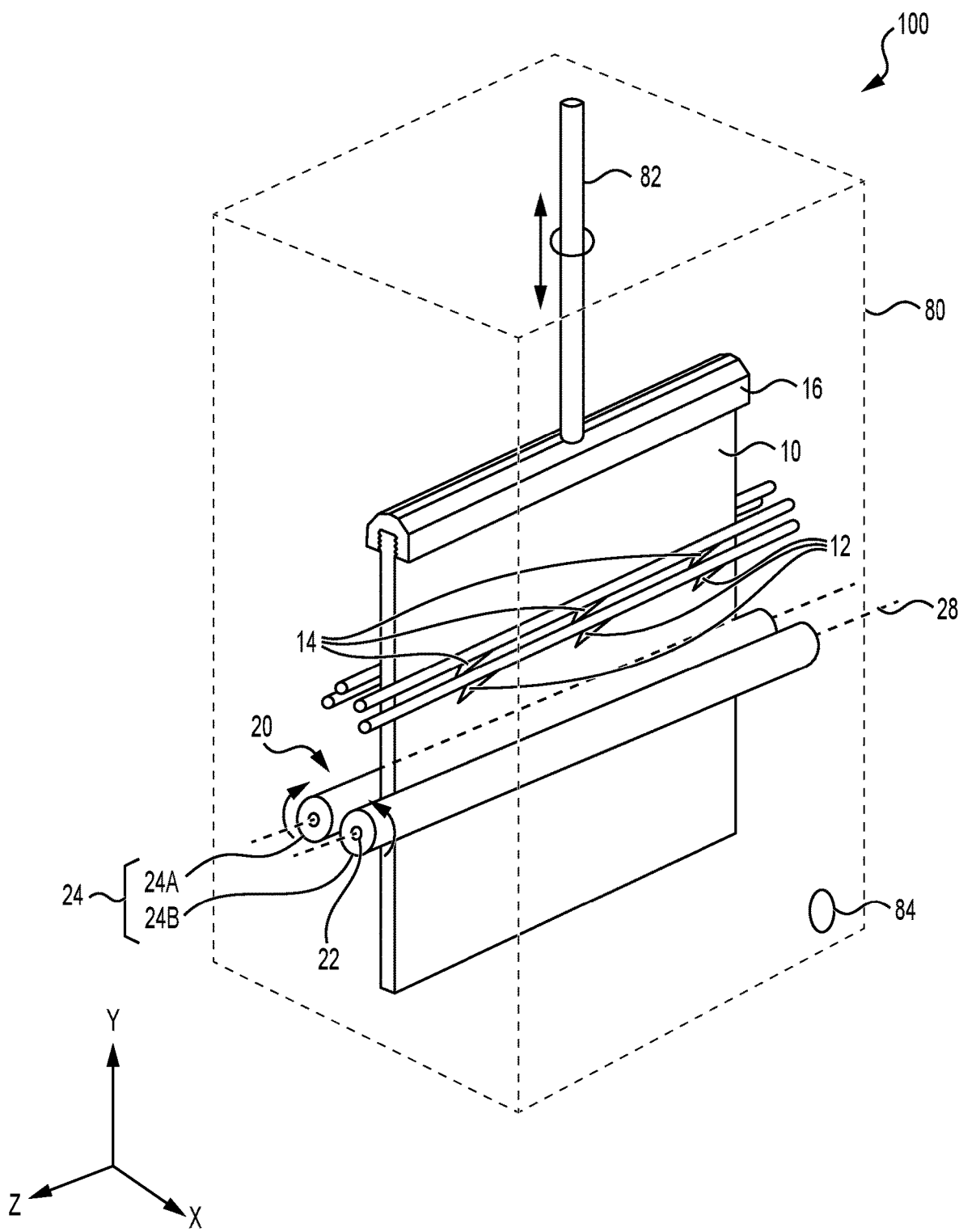
FIG. 1B is a simplified schematic perspective view of an exemplary apparatus of the current disclosure.

FIGS. 1A and 1B are simplified schematic illustrations of a disclosed apparatus (or device 100) for cleaning (e.g., by wet processing) a substrate 10. FIG. 1A is a schematic of a cross-sectional view and FIG. 1B is a schematic of a perspective view. As used herein, the term "substrate" broadly refers to any component or part on which electronic devices and integrated circuits are fabricated. For example, a substrate may include a semiconductor wafer having opposite flat surfaces, a glass panel, a printed circuit board (PCB), an organic substrate, an electronic package that may support one or more integrated circuit (IC) chips or devices thereon. In general, the substrate may be made of any material and may have any shape (circular, rectangular, square, etc.) any size. In some embodiments, the substrate may be a square or rectangular PCB or glass panel. However, this is only exemplary, and in general, any type and shape of substrate may be cleaned using device 100.

Device 100 includes a double-sided scrubber 20 (hereinafter referred to as a scrubber 20) that includes a pair of brushes 24A, 24B configured to clean/scrub opposite sides of a substrate 10. As illustrated in FIG. 1, the pair of brushes 24A, 24B of scrubber 20 are disposed on the opposite sides (e.g., opposite surfaces) of the substrate 10. The pair of brushes 24A, 24B may be collectively or individually referred to as brush(es) 24. In some embodiments, the brushes 24 of scrubber 20 may be disposed within a housing 80 (or enclosure) such that the liquids/chemicals used in the cleaning and the resulting debris remains contained within the housing 80. Each brush 24 may be substantially cylindrical and extend along a longitudinal axis 28 (e.g., in the Z-direction) that extends substantially parallel to the substrate surface. The pair of brushes 24 of scrubber 20 may be arranged substantially parallel to each other. In some embodiments, the pair of brushes 24 may be pressed on the opposite sides of the substrate 10. During operation of device 100, the brushes 24 may press and rotate (about their respective longitudinal axes 28) against the opposite sides of the substrate 10. Although not a requirement, in some embodiments, the brushes 24 on opposite sides of the substrate 10 may rotate in opposite directions. For example, as illustrated in FIG. 1A, brush 24A may rotate in the clock-wise direction and brush 24B may rotate in the counter clock-wise direction (or vice versa). In some embodiments, both brushes 24 may rotate in the same direction (clock-wise or counter clock-wise).

Brush 24 may be made of, for example, polymer (e.g., nylon, polyester, etc.) bristles, molded PVA sponge, etc., and may be disposed around a central conduit 22. During operation of device 100, DI water (or another liquid) may be directed to the rotating brushes 24 of scrubber 20 through the conduit 22. This DI water may pass through the brushes 24 and flow on (or clean) the surfaces of the substrate 10 that the brushes 24 are rotating against. In some embodiments, the brushes 24 may be configured to rotate at a rotation speed between about 0-700 (10-500) RPM. In some embodiments, the flow rate of the DI water through each brush 24 may be between about 0-7 liters per minute (i.e., no DI water flow to a flow rate of 7 lit/min). In some embodiments, the brushes 24 may be pressed against the substrate 10 such that each brush 24 is compressed between about 0-10 mm (i.e., just touching to compressing into the substrate by about 10 mm) in, for example, 0.2 mm increments. Although not shown in FIGS. 1A and 1B, device 100 may include a mechanism (e.g., motors, etc.) to rotate the brushes 24 and a mechanism (actuators, slides, etc.) to vary the amount of compression of each brush 24 against the substrate 10 (i.e., vary the compression force of the brushes 24 on the substrate 10).

Device 100 may also include a mechanism to physically move the substrate 10 back-and-forth (e.g., in the Y direction as shown by arrow A in FIG. 1A) between the brushes 24. In general, any mechanism may be used to hold and move the substrate 10 in this manner between the brushes 24. In some embodiments, as illustrated in FIGS. 1A and 1B, a gripper 16 may grip an end (e.g., top end) of the substrate 10 and move the substrate 10 back-and-forth (e.g., push and pull) through the space between the brushes 24 at a predetermined rate. As the substrate 10 moves back-and-forth between the brushes 24, the brushes 24 rotate against the substrate surfaces and scrub these surfaces. Meanwhile, the DI water flowing through the brushes 24 may clean the substrate surfaces and prevent (or reduce) redeposition of debris and cleaning by-products on the substrate and brush surfaces.

Device 100 may also include a plurality of sets of nozzles 12, 14 arranged on opposite sides of the substrate 10. Each set of nozzles 12, 14 may be configured to spray a different chemical at the brush-substrate interface (hereafter referred to as the interface). For example, nozzles 12 may spray a first chemical and nozzles 14 may spray a different chemical at the interface. As used herein, the term interface refers to regions (of the substrate) on opposite sides of the substrate 10 that the rotating brushes 24 are in contact with at any particular time. Since the substrate is continuously moving back-and-forth between the pair of brushes 24, the brush-substrate interface changes over time (e.g., moves up and down on the substrate surface as the substrate moves back-and-forth between the brushes 24). Each set of nozzles 12, 14 may include multiple pairs of nozzles (e.g., 2-10 pairs) arranged along the length of the brushes 24 (e.g., along the Z-axis). Each pair of nozzles of a set may include two nozzles arranged in a mirror-symmetric manner on opposite sides of the substrate 10. Each set of nozzles 12, 14 may include any number (e.g., 2-15) of pairs of nozzles. In some embodiments, each nozzle 12, 14 may be a cone spray nozzle configured to discharge a substantially conical spray of liquid to the interface. The nozzles 12, 14 of each set may be spaced apart along the length of the brushes 24 (e.g., in the Z direction) and arranged to evenly wet the substrate 10 along the entire length of the interface. In some embodiments, the nozzles 12, 14 may be arranged such that their central axes (e.g., central axis 12A of nozzle 12 and central axis 14A of nozzle 14) are inclined at an angle θ between about 20-70 degrees with the substrate surface. In some embodiments, angle θ may be between about 30-60 degrees.

In some embodiments, during operation of device 100, each set of nozzles 12, 14 may be configured to spray a different chemical at the interface. For example, nozzles 12 may be fluidly coupled to a supply of a first chemical (e.g., chemical A) and configured to spray the first chemical at the interface. And nozzles 14 may be fluidly coupled to a supply of a second chemical (e.g., chemical B) and configured to spray the second chemical at the interface. Although only two sets of nozzles 12, 14 are illustrated in FIGS. 1A and 1B, this is only exemplary. In general, any number of sets of nozzles (1-10) may be provided. In other words, in some embodiments, only a single set of nozzles may be provided, and all the nozzles of this single nozzle set may be configured to selectively spray different liquids at the interface. For example, valves may couple and decouple different liquid supplies from the nozzles and selectively direct these different liquids to the nozzles as desired. While in other embodiments, multiple sets of nozzles (e.g., 2-10) may be provided and at least some of these sets of nozzles may be configured to spray a different chemical than the other sets. Although sets of nozzle (or nozzle set) 12 and nozzle set 14 are illustrated as being spaced apart and physically separate from each other (e.g., see FIG. 1B), this is only exemplary. The different nozzle sets may be arranged and provided in any manner in device 100. In some embodiments, the different nozzle sets may be provided as part of a nozzle head that, for example, extends (or moves) along the length of the brushes 24. For example, a first nozzle head may incorporate all the nozzles of nozzle sets 12 and 14 positioned on one side of substrate 10 and a second nozzle head may incorporate all the nozzles of nozzle sets 12 and 14 positioned on the opposite side of the substrate 10.

As explained previously in the background section, in an exemplary conventional wet processing application, a substrate 10 may be dipped in tanks containing a first chemical (chemical A), DI water, and a second chemical (chemical B) in sequence to prepare the substrate for subsequent processing. In some embodiments, an exemplary device used to clean the substrate by wet processing may include a single set of nozzles which may selectively direct different liquids (e.g., a first chemical, DI water, and a second chemical) to the interface at different time periods. For example, when the substrate 10 is moving back-and-forth between the brushes 24, the nozzles of the single nozzle set may first direct the first chemical to the interface for a first time period. Thereafter, flow of the first chemical through the nozzles may be stopped and valves may fluidly couple a DI water supply to the nozzles. All the nozzles may now spray DI water to the interface for a second time period. The flow of DI water through the nozzles may then be stopped and the valves may fluidly couple the second chemical to the nozzles. The nozzles may now spray the second chemical at the interface for a second time period. The different liquids used in cleaning the substrate may thus be sequentially sprayed at the interface using the same set of nozzles by using valves to selectively direct a desired liquid to the nozzles.

Using a single set of nozzles to spray different liquids through the same set of nozzles, as described above, may not be suitable for some applications, for example, because of the time lag associated with switching the liquid flowing through the nozzles. Therefore, in some embodiments, an exemplary device 100 used to perform the above-described cleaning operation may include multiple sets of nozzles with each set of nozzles fluidly coupled to a different liquid supply. For example, a first set of nozzles to spray the first chemical, a second set of nozzles to spray DI water, and a third set of nozzles to spray the second chemical, etc. These multiple sets of nozzles may be operated in sequence. For example, as the substrate 10 moves back-and-forth between the brushes 24, the first set of nozzles (e.g., nozzles 12) may spray the first chemical at the interface for a first time period. Then, the flow of the first chemical through the first set of nozzles may be stopped, and a spray of DI water may be directed to the interface for a second time period through the second set of nozzles. The flow of DI water may then be stopped and a spray of the second chemical may be directed to the interface for a third time period through the third set of nozzles. Since the different sets of nozzles are fluidly connected to different liquid sources, the liquid being sprayed at the interface can be changed instantly.

The first, second, and third time period may have the same or different (time) values depending on the application. For example, in embodiments where the substrate surface is contaminated more with the type of contaminants that may be removed using the first chemical than the second chemical, the first time period may be more than the third time period. In some embodiments, the flow of DI water through the brushes 24 may be continued during the first, second, and third time periods. That is, DI water may flow through the brushes 24 towards the substrate 10 during the entire time the different liquids are sprayed at the interface (through the same set of nozzles or through different sets of nozzles). The DI water flowing through the brushes 24 may assist in preventing the applied liquids and by-products of the cleaning process from being deposited on the brushes 24 and/or the substrate 10.

During operation of the device 100, each chemical and DI water rinse step may include one or more back-and-forth cycles of substrate movement (e.g., 2-20 cycles) between the brushes 24. For example, during each of the first, second, and third time periods (i.e., when the first chemical is being sprayed at the interface, DI water is being sprayed at the interface, and when the second chemical is being sprayed at the interface), the substrate 10 may be moved back-and-forth between the brushes 24 multiple times (e.g., between 2 and 20 times). In some embodiments the substrate 10 may be moved back-and-forth between the brushes 24 at a rate of, for example, between about 5-50 mm/sec. Thus, a multi-chemical, multi-step cleaning process may be performed using device 100 by moving the substrate 10 back-and forth between the brushes 24 while the brushes 24 apply scrubbing action to remove surface contaminants from the substrate surfaces. The contaminants may subsequently be removed from the surfaces using DI water.

In some embodiments, housing 80 may include a drain 84 to remove the sprayed liquids and DI water from the housing 80. In some embodiments, the volume within housing 80 may be maintained at a sub-atmospheric pressure (e.g., between about 1-2 inches of mercury column) to remove any moisture or mist that may accumulate within the housing 80 as a result of the spraying. In some embodiments additional nozzle bars maybe placed inside the housing to spray DIW onto the substrate. In some embodiments, the gripper 16 that holds the substrate 10 within the housing 80 may pass into the housing 80 through a sealed hole 82. It should be noted that the configuration of the device 100 described above is only exemplary. Many variations are possible. For example, in some embodiments, in addition to, or as an alternative to gripper 16, the substrate 10 may be supported at its bottom end, for example, using a slide that may assist in moving the substrate 10 back-and-forth between the brushes 24. For example, the gripper 16 may release the substrate 10 and the slide may support the substrate when the top end of the substrate (e.g., the region of the substrate 10 under the gripper 16) passes between the brushes 24.

Further, although the device 100 is described as cleaning a single substrate 10, this is only exemplary. In some embodiments, multiple substrates may be simultaneously cleaned using a disclosed device. For example, multiple double-sided scrubbers 20 may be spaced apart in the X and/or the Z direction with each double-sided scrubber cleaning a different substrate. Each of these double-sided scrubbers 20 may be positioned in the same housing or in different housings. In some embodiments, the device 100 may include sensors and/or measurement devices to detect the level of contamination on the substrate surface (e.g., in situ) and adjust one or more parameters of the process (e.g., compression force of brushes 24 on the substrate surface, brush rotational speed, rate of substrate back-and-forth movement, rate of liquid flow, rate of DI water flow through the brushes, etc.) to optimize the cleaning process, for example, using a feedback loop.

Figure 2:
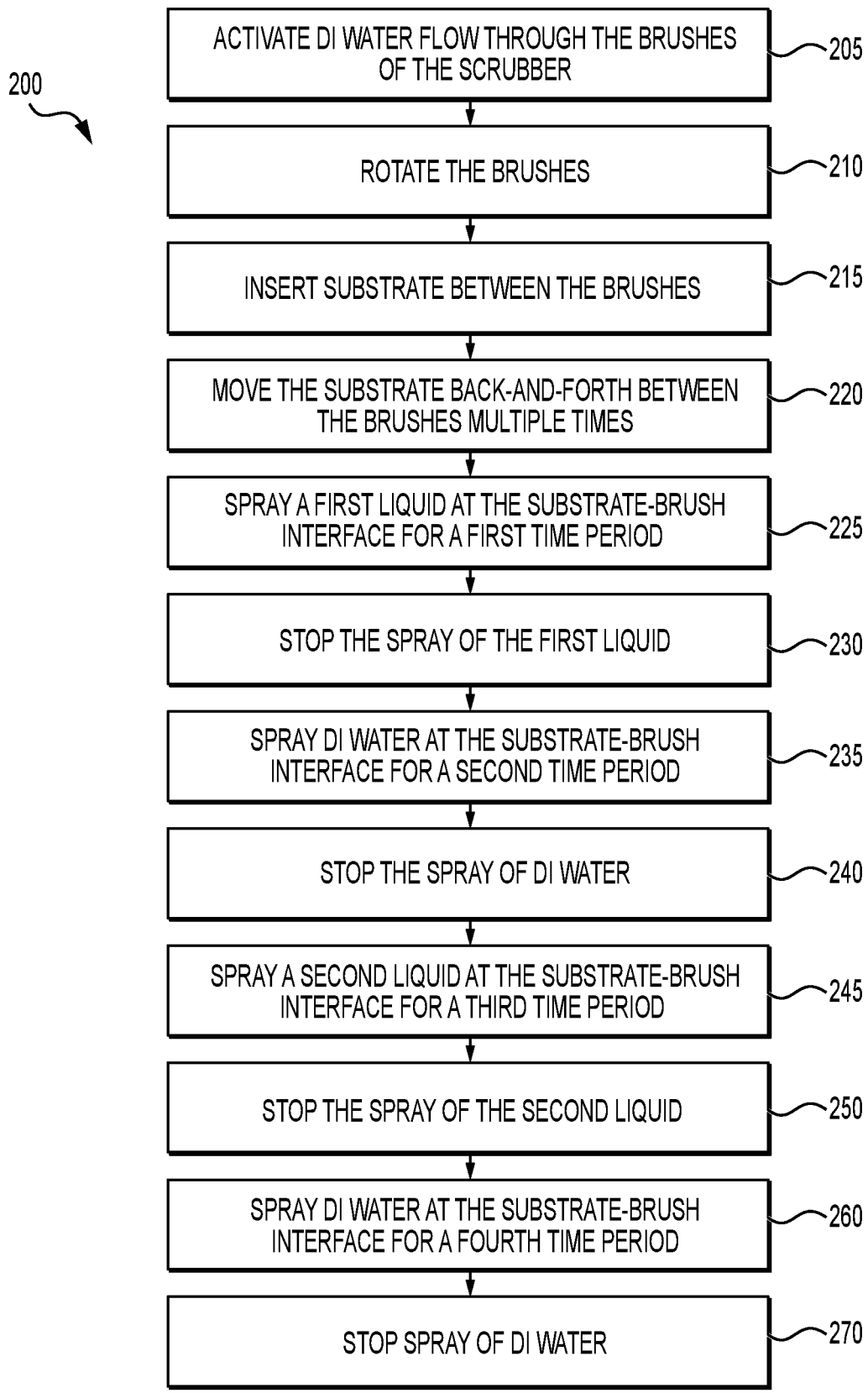
FIG. 2 is a flow chart of an exemplary process used to clean a substrate using a disclosed device.

An exemplary cleaning process using the above-described device 100 will now be described. FIG. 2 is a flow chart of an exemplary process 200 used to clean a substrate 10 using wet processing. In process 200, DI water flow through the brushes 24 of scrubber 20 may be activated (step 205) and the brushes 24 may be rotated (step 210). A substrate 10 may be inserted between the brushes 24 of the scrubber 20 (step 215) such that each brush 24 compresses into the substrate by between about 0-5 mm. The substrate may be moved back-and-forth multiple times between the brushes 24 (step 220). As the brushes 24 rotate against the substrate surfaces, these surfaces get scrubbed by the brushes 24. The DI water flow through the brushes 24 may assist in removing any debris that results from the scrubbing action. A first liquid (alkaline solution, etc.) may be sprayed at the brush-substrate interface for a first time period (step 225). After the first time period, the spray of first liquid may be stopped (step 230) and DI water may be sprayed at the interface for a second time period (step 235). After the second time period, the spray of DI water may be stopped (step 240) and a second liquid may be sprayed at the interface for a third time period (step 245). After the third time period, the spray of the second liquid may be stopped (step 250) and DI water may be sprayed at the interface for a fourth time period (step 260). After the fourth time period, the spray of DI water may be stopped (step 270). In some embodiments, additional liquids may be sprayed at the interface in an analogous manner with a DI water spray between two liquid sprays and after the last liquid spray. In some embodiments, the cleaning process 200 may end with DI water spraying. As explained previously, in some embodiments, the same set of nozzles may be used to spray the first liquid, DI water, and the second liquid (in steps 225, 235, and step 245), while in other embodiments, different sets of nozzles may be used to spray the first liquid, DI water, and the second liquid.

The process described above is merely exemplary and many variations are possible. For example, the steps need not be performed in the order indicated (e.g., step 210 may be performed before step 205, step 215 may be performed before step 210 and/or step 205, etc.), some of the illustrated steps may be eliminated or combined, etc. A person of ordinary skill in the art would recognize other possible variations.

What is claimed is:

1. A device for cleaning a substrate, comprising:
a double-sided scrubber including a pair of brushes, wherein each brush of the pair of brushes is substantially cylindrical and is configured to rotate about a longitudinal axis of the brush, wherein a first brush of the pair of brushes extends around a first conduit, wherein a second brush of the pair of brushes extends around a second conduit, wherein the first conduit is configured to direct a liquid through the first brush, wherein the second conduit is configured direct a liquid through the second brush, and wherein the longitudinal axes of the pair of brushes are arranged parallel to each other and on opposite sides of the substrate;
a gripper configured to grip the substrate and translate the substrate, wherein the gripper is configured to translate the substrate in a back-and-forth motion on a straight axis located between the brushes of the pair of brushes, and wherein the gripper is configured to translate the substrate in the back-and-forth motion while the first and second brushes are in contact with the substrate;
a first set of nozzles fluidly coupled together and configured to spray a first liquid at an interface between the substrate and the pair of brushes, wherein the first set of nozzles includes a plurality of pairs of first nozzles spaced apart from each other along the longitudinal axis of each brush, and wherein each pair of first nozzles includes two first nozzles mirror-symmetrically positioned on opposite sides of the substrate; and
a second set of nozzles fluidly coupled together and configured to spray a second liquid at the interface, wherein the second liquid is different from the first liquid, wherein the second set of nozzles includes a plurality of pairs of second nozzles spaced apart from each other along the longitudinal axis of each brush, and wherein each pair of second nozzles includes two second nozzles mirror-symmetrically positioned on opposite sides of the substrate.

2. The device of claim 1, further including a third set of nozzles fluidly coupled together and configured to spray a third liquid at the interface, wherein the third set of nozzles includes a plurality of pairs of third nozzles spaced apart from each other along the longitudinal axis of each brush, and wherein each pair of third nozzles includes two third nozzles mirror-symmetrically positioned on opposite sides of the substrate.

3. The device of claim 1, further including a housing enclosing the pair of brushes, the first set of nozzles, and the second set of nozzles.

4. The device of claim 3, wherein a volume within the housing is maintained at a sub-atmospheric pressure.

5. The device of claim 1, wherein the gripper is configured to translate the substrate back-and-forth at a rate of about 5-50 mm/sec.

6. The device of claim 1, wherein the pair of brushes are arranged such that, when the substrate is positioned between the pair of brushes, each brush of the pair of brushes compresses by a distance between about 0-3 mm.

7. The device of claim 1, wherein each conduit is configured to direct about 0.5-5 liters/minute of a liquid through a respective brush of said pair of brushes.

8. The device of claim 1, wherein each brush of the pair of brushes is configured to rotate at a rotational speed between about 10-500 RPM.

9. The device of claim 8, wherein the brushes of the pair of brushes are configured to rotate in opposite directions.

10. The device of claim 1, wherein the plurality of pairs of first nozzles includes 2-10 pairs of first nozzles, and the plurality of pairs of second nozzles includes 2-10 pairs of second nozzles.

11. The device of claim 1, wherein each brush of the plurality of brushes comprises molded PVA or polymer bristles.

12. The device of claim 1, wherein each first nozzle of the first set of nozzles and each second nozzle of the second set of nozzles includes a central axis inclined at an angle between about 20-70 degrees with a surface of the substrate.

13. The device of claim 1, further including a fourth set of nozzles fluidly coupled together and configured to spray of a fourth liquid at the interface, wherein the fourth set of nozzles includes a plurality of pairs of fourth nozzles spaced apart from each other along the longitudinal axis of a brush of the pair of brushes, and wherein each pair of fourth nozzles includes two fourth nozzles mirror-symmetrically positioned on opposite sides of the substrate.

14. The device of claim 1, wherein each conduit is configured to direct a liquid that is different from the first and second liquids through a respective brush of said pair of brushes.

15. The device of claim 1, wherein the substrate is configured to translate back-and-forth along an axis perpendicular to a plane containing the longitudinal axis of each brush of the pair of brushes.

* * * * *